(12) United States Patent
Furukawa et al.

(10) Patent No.: US 6,387,783 B1
(45) Date of Patent: *May 14, 2002

(54) METHODS OF T-GATE FABRICATION USING A HYBRID RESIST

(75) Inventors: Toshiharu Furukawa, Essex Junction; Mark C. Hakey, Fairfax; Steven J. Holmes, Milton; David V. Horak, Essex Junction; Paul A. Rabidoux, Winooski, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,267

(22) Filed: Apr. 26, 1999

(51) Int. Cl.[7] .......................... H01L 21/28; H01L 21/44
(52) U.S. Cl. ...................... 438/574; 438/182; 438/300; 438/579
(58) Field of Search ................................. 438/167, 172, 438/177, 182, 299, 300, 572–574, 576–579, 947; 148/DIG. 100, DIG. 106

(56) References Cited

U.S. PATENT DOCUMENTS

| | | | |
|---|---|---|---|
| 5,776,660 A | | 7/1998 | Hakey et al. ............... 430/296 |
| 5,856,232 A | | 1/1999 | Yang et al. ................. 438/571 |
| 5,858,824 A | * | 1/1999 | Saitoh ........................ 438/167 |
| 6,114,082 A | * | 9/2000 | Hakey et al. ............ 430/270.1 |
| 6,153,499 A | * | 11/2000 | Anda et al. ................. 438/579 |
| 6,221,704 B1 | * | 4/2001 | Furukawa et al. .......... 438/197 |

OTHER PUBLICATIONS

T. Suemitsu et al., "30–nm Gate InAlAs/InaGaAs HEMTs Lattice Matched to InP Substrates," International Electron Devices Meeting 1998 Technical Digest, pp. 223–226 (1998).

M.M. Ahmed et al., "Novel electron beam lithography technique for submicron T–gate fabrication", J. Vac. Sci. Technol. B., vol. 15, No. 2, pp. 306–310 (1997).

R. Grundbacher et al., "Utilization of an Electron Beam Resist Process to Examine the Effects of Asymmetric Gate Recess on the Device Characteristics of AlGaAs/InGaAs PHEMT's", IEEE Transactions on Electron Devices, vol. 44, No. 12, pp. 2136–2141 (1997).

H. Brech et al., "Influence of T–Gate Shape and Footprint Length on PHEMT High Frequency Performance", 19th Annual GaAs IC Symposium, Technical Digest 1997, Anaheim, California, pp. 66–69 (1997).

A. Hulsmann et al., "0.15 µm T–Gate E–Beam Lithography Using Crosslinked P(MMA/MAA) Developed in Ortho–Xylene Resulting in High Contrast and High Plasma Stability for Dry Etched Recess Gate Pseudomorphic MODFETs for MMIC Production", Microelectronic Engineering 23, pp. 437–440 (1994).

* cited by examiner

Primary Examiner—Carl Whitehead, Jr.
Assistant Examiner—Jamie L Brophy
(74) Attorney, Agent, or Firm—DeLio & Peterson, LLC; Kelly M. Reynolds; Mark F. Chadurjian (57) ABSTRACT

Methods for forming a T-gate on a substrate are provided that employ a hybrid resist. The hybrid resist specifically is employed to define a base of the T-gate on the substrate with very high resolution. To define a base of the T-gate, a hybrid resist layer is deposited on the substrate. A mask having a reticle feature with an edge is provided and is positioned above the hybrid resist layer so that the edge of the reticle feature is above a desired location for the base of the T-gate. Thereafter, the hybrid resist layer is exposed to radiation through the mask, and the exposed hybrid resist layer is developed to define an opening therein for the base of the T-gate. Preferably the loop feature formed in the hybrid resist layer by the reticle feature during exposure is trimmed. The T-gate may be completed by employing any known T-gate fabrication techniques.

18 Claims, 5 Drawing Sheets

METHODS OF T-GATE FABRICATION USING A HYBRID RESIST

FIELD OF THE INVENTION

The present invention relates to T-gate fabrication, and more particularly to fabricating T-gates using a hybrid photoresist ("resist").

BACKGROUND OF THE INVENTION

A T-gate is a gate conductor structure for a semiconductor device (e.g., metal semiconductor field effect transistors (MESFETs), a high electron mobility transistors (HEMTs), etc.) in which the top of the gate conductor structure is wider than the base of the gate conductor structure. The base of the T-gate is made narrow so that the channel length of the semiconductor device is short (e.g., for high performance such as a high operating frequency and a high transconductance), and the top of the T-gate is made wide so that the conductance of the T-gate remains high (e.g., for high switching speeds).

Because electron beam ("e-beam") lithography has a resolution of better than 0.1 microns, e-beam lithography is the most commonly used technique for fabricating submicron T-gates. However, despite its fine resolution, because the exposing e-beam must pass through relatively thick resist films (e.g., about one micron), e-beam lithography suffers from poor linewidth control in the multi-layered stacks used in typical T-gate processes. Further, e-beam exposure is a direct write process which is both slow and expensive. Accordingly, a need exists for improved methods of forming T-gate structures.

SUMMARY OF THE INVENTION

To overcome the needs of the prior art, novel methods for forming a T-gate structure ("T-gate") on a substrate (e.g., a semiconductor substrate such as GaAs, SiGe, etc.) are provided that employ a hybrid resist. The hybrid resist specifically is employed to define a base of the T-gate on the substrate with very high resolution (e.g., less than 0.05 microns).

To define a base of the T-gate, a hybrid resist layer is deposited on the substrate. A mask having a reticle feature with an edge is provided and is positioned above the hybrid resist layer so that the edge of the reticle feature is above a desired location for the base of the T-gate. Thereafter, the hybrid resist layer is exposed to radiation (e.g., deep ultraviolet light, x-rays, I-line, ion beam or e-beam) through the mask, and the exposed hybrid resist layer is developed to define an opening therein for the base of the T-gate. Preferably the loop feature formed in the hybrid resist layer by the reticle feature during exposure is trimmed.

The T-gate may be completed by employing any known T-gate fabrication techniques. Preferably T-gate formation is completed by depositing a second resist layer (e.g., a negative photoresist) over the hybrid resist layer, and by forming a second opening in the second resist layer for a top of the T-gate. A gate metallization layer then is deposited over the second resist layer, within the opening of the second resist layer and within the opening of the hybrid resist layer so as to form the T-gate therein. Thereafter, the gate metallization layer that covers the second resist layer is lifted off, and any remaining second resist layer and the hybrid resist layer are removed from the substrate.

Alternatively, T-gate formation preferably is completed by etching a groove in the substrate through the opening in the hybrid resist layer, by removing the hybrid resist layer and by depositing a conductive material over the substrate to form the base of the T-gate within the groove. Thereafter a second resist layer is deposited over the conductive material and an opening is formed in the second resist layer for a top of the T-gate. The base of the T-gate thereby is exposed. A gate metallization layer is deposited over the second resist layer, within the opening of the second resist layer and over the exposed base of the T-gate, and the gate metallization layer that covers the second resist layer is lifted-off. To complete the T-gate, any remaining second resist layer is removed from the substrate and any unnecessary conductive material (e.g., conductive material that does not form part of the T-gate structure) is etched away. Note that the portion of the gate metallization layer that forms the top of the T-gate serves as an etch mask during the etching of conductive material which does not form part of the T-gate structure.

By employing a hybrid resist to form T-gate structures, the time, expense and poor linewidth control associated with e-beam lithography is avoided. Additionally, because the use of a hybrid resist results in fine, uniform features with image quality that is nearly independent of exposure dose or mask dimensions, device linewidth remains nearly constant across each die and from substrate to substrate.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
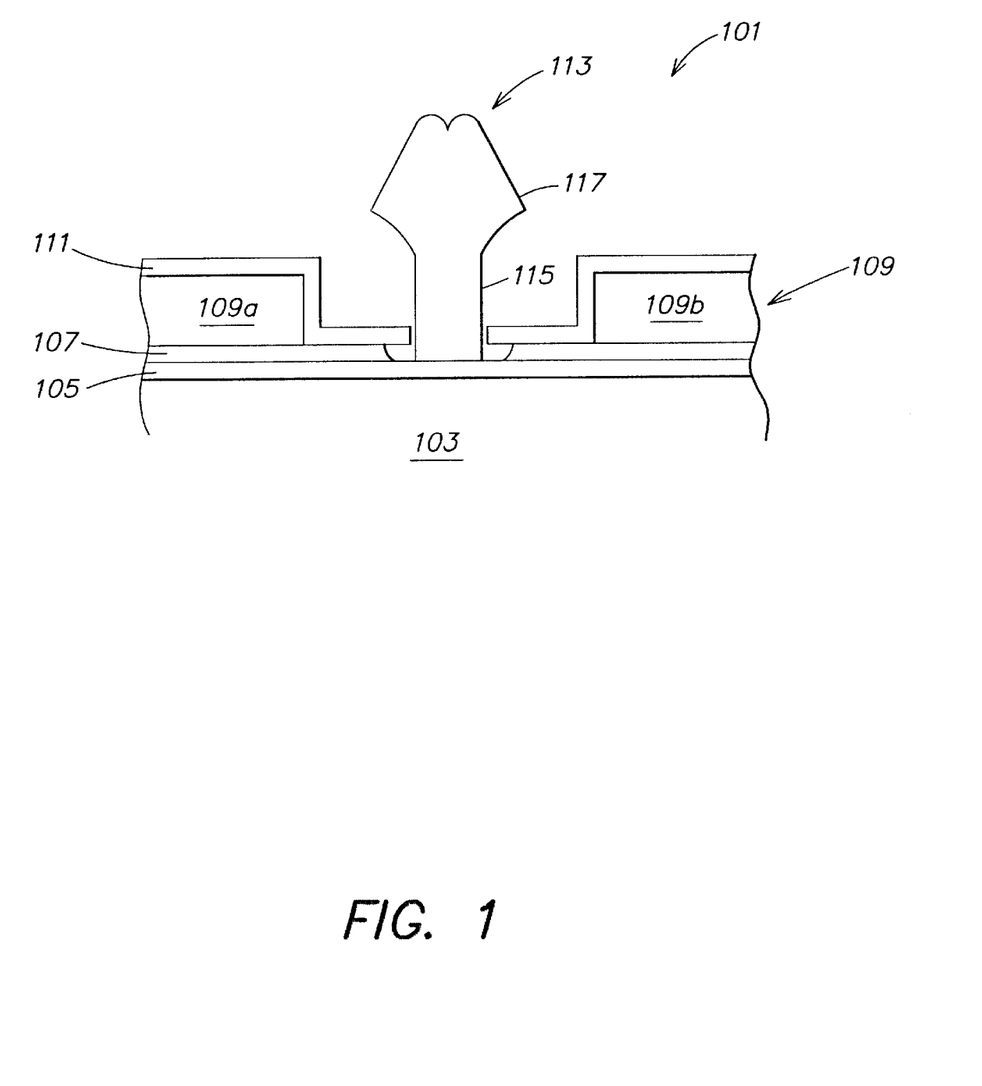
FIG. 1 is a cross-sectional diagram illustrating an inventive T-gate structure fabricated using novel fabrication methods in accordance with the present invention.

FIG. 1 is a cross-sectional diagram illustrating an inventive T-gate structure 101 fabricated using novel fabrication methods in accordance with the present invention. The T-gate structure 101 comprises a GaAs substrate layer 103 having an etch stop layer 105 formed thereon, a GaAs cap layer 107 formed on the etch stop layer 105, and a source/drain Ti—Pt—Au metallization layer 109 formed on the GaAs cap layer 107. The source/drain Ti—Pt—Au metallization layer 109 has been patterned via a lift-off process so as to form source region 109a and drain region 109b as shown in FIG. 1. The T-gate structure 101 further comprises a silicon nitride layer 111 formed on the source/drain regions 109a, 109b and on the exposed portion of the GaAs cap layer 107. Both the silicon nitride layer 111 and the GaAs cap layer 107 are etched to expose the etch stop layer 105, and a submicron T-gate 113 is formed thereon. The T-gate 113 comprises a base 115 and a top 117 as shown.

In the preferred embodiment, the GaAs substrate layer 103 comprises a 27 nanometer InGaAs/AlGaAs/GaAs film stack (not shown in detail) grown by molecular beam epitaxy (MBE) on a semi-insulating GaAs substrate. The etch stop layer 105 comprises 3 nanometers of $Al_{0.2}Ga_{0.8}As$ which acts as a reactive ion etching (RIE) etch stop or as a wet etch stop during etching of the GaAs cap layer 107.

The GaAs cap layer 107 comprises 40 nanometers of GaAs doped with silicon to a level of about $3 \times 10^{18}/cm^3$. The silicon nitride layer 111 is deposited via chemical vapor deposition (e.g., employing silane and ammonia as is known in the art) to a thickness of about 20–50 nanometers to aid in the adhesion of photoresist to the source/drain Ti—Pt—Au metallization layer 109 (as described below). For an x-ray exposure, the preferred thickness for the silicon nitride layer 111 is about 25 nanometers. However, when an optical exposure such as a deep ultraviolet exposure is employed, the silicon nitride layer 111 (typically a nitrogen rich silicon nitride layer or alternatively a silicon oxynitride layer) also functions as an anti-reflective coating material in addition to functioning as an adhesion layer. To serve as an anti-reflective coating material, film thickness is chosen so as to minimize reflection from the silicon nitride layer 111 (e.g., about 45–60 nanometers). The T-gate base 115 preferably comprises Ti—Pt—Au or WSiN and the T-gate top 117 preferably comprises Ti—Pt—Au.

To form the inventive T-gate structure 101 of FIG. 1, novel fabrication methods (described in detail below) are employed that utilizes a hybrid resist to define the narrow base 115 of the submicron T-gate 113. The hybrid resist comprises a combination of positive and negative photoresists and is described in detail in U.S. patent application Ser. No. 08/715,287, filed Sep. 19, 1996, which is hereby incorporated by reference herein in its entirety.

Figure 2A:
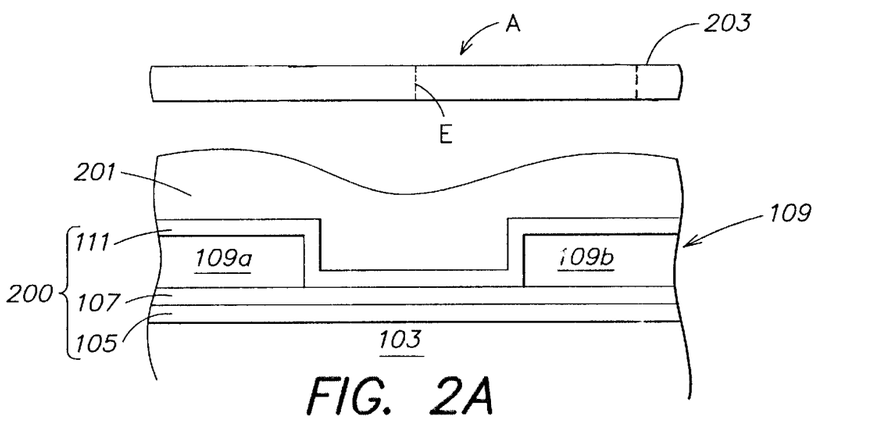
FIGS. 2A–E are cross-sectional illustrations of a first novel fabrication method used to fabricate the T-gate of FIG. 1.

FIGS. 2A–E are cross-sectional illustrations of a first novel fabrication method used to fabricate the T-gate structure 101. With reference to FIG. 2A, a structure 200 having the GaAs substrate layer 103, the etch stop layer 105, the GaAs cap layer 107, the source/drain regions 109a, 109b and the silicon nitride layer 111 is formed by conventional techniques as is well known in the art. Thereafter, a hybrid resist layer 201 having a thickness of about 200–500 nanometers, preferably 300 nanometers, is deposited on top of the silicon nitride layer 111. As described in previously incorporated U.S. patent application Ser. No. 08/715,287, filed Sep. 19, 1996, the properties of the hybrid resist layer 201 are such that if the resist layer is not exposed to radiation (e.g., X-ray, deep ultra-violet (UV), I-line, ion beam-or e.-beam), it will not be washed away by developing solution; if the resist layer 201 is fully exposed to radiation, it will not be washed away by developing solution; and if the resist layer 201 is partially exposed to radiation, it will be washed away by developing solution.

Following deposition of the hybrid resist layer 201, the hybrid resist layer 201 is exposed to X-rays through a mask 203 having a reticle feature A. An edge E of the mask 203's reticle feature A is placed over the area where the base 115 of the submicron T-gate 113 is to be formed. In this manner, the portion of the hybrid resist layer 201 underlying the edge E is only partially exposed to X-ray radiation during X-ray exposure and therefore will be washed away by developing solution. The preferred X-ray dose is about 150–250 milliJoules/$cm^2$, most preferably about 180–190 milliJoules/$cm^2$.

Figure 2B:
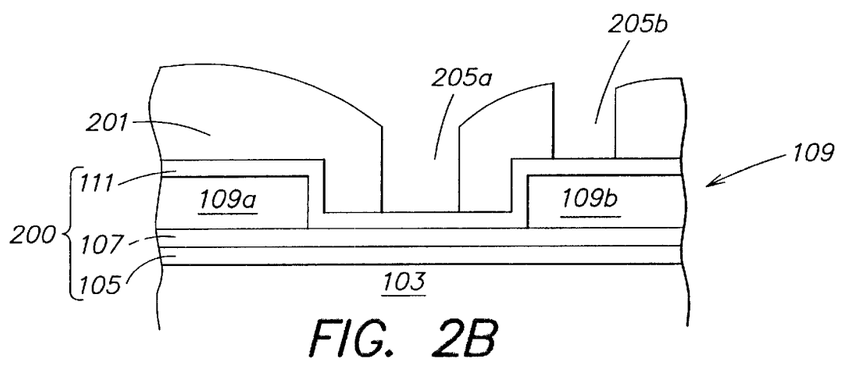

After the hybrid resist layer 201 is exposed, it is baked for about 90 seconds at 90° C. and then is developed. After developing, the hybrid resist layer 201 is UV hardened and baked (e.g., for about 90 seconds at 120° C.) in order to cross-link the resin and render it insoluble during a second developing process (described below). FIG. 2B illustrates areas 205a, 205b where sections of the hybrid resist layer 201 are washed away by developing solution.

Exposure to radiation through the mask 203 enables the definition of high resolution patterns (e.g., less than 0.05 microns) since only the resist under the edges of the reticle feature A receives partial exposure to the radiation, and is therefore washed away by the developing solution, leaving fine, uniform features 205a, 205b having qualities practically independent of radiation dose and reticle size. The fine, uniform features 205a, 205b re formed as a loop having a pattern consistent with the edges of the reticle feature A's shape, and therefore, must be trimmed before metallization takes place in order to avoid shorting the submicron T-gate 113.

Figure 2C:
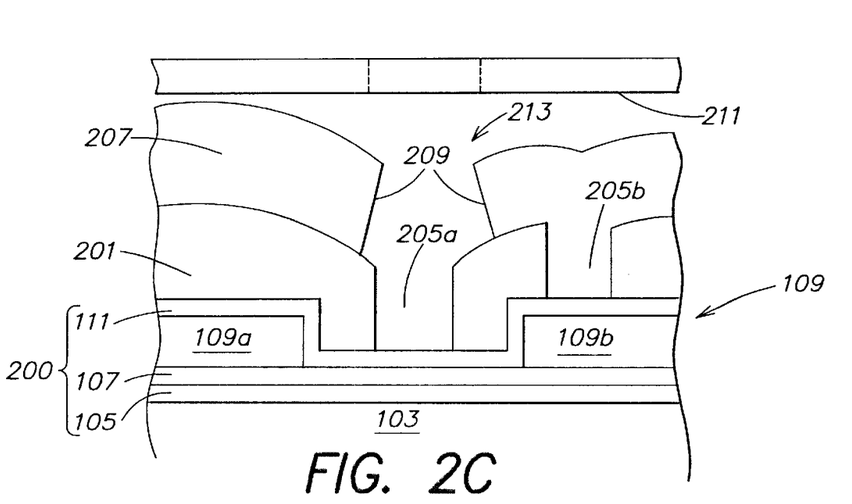

After the hybrid resist layer 201 is UV hardened and baked, a second resist layer 207 is deposited over the hybrid resist layer 201. The preferred thickness for the second resist layer 207 is about 0.8 to 1.2 microns, most preferably about 1.0 micron. FIG. 2C illustrates the structure 200 following depositing, exposing, baking and developing of the second resist layer 207. Generally, the second resist layer 207 comprises a negative resist such as a modified image reversal process I-line exposure resist because, following developing, a negative resist results in an undercut resist profile 209 which is favorable for facilitating the lift-off of a gate metallization layer (described below). Modified image reversal processes for I-line resists are well known in the art, such as those described by S. MacDonald, R. Miller and C. G. Willson, "The Production of a Negative Image in a Positive Photoresist," Kodak Interface (1982) and by E. Alling and C. Stauffer, Proceedings of the SPIE, vol. 539, p. 194 (1985). The undercut resist profile 209 may be enhanced by adding an actinic radiation absorbing dye to the second resist layer 207. The second resist layer 207 also serves to prevent shorting of the submicron T-gate 113, by filling in a portion of the loop (e.g., feature 205b in FIG. 2B) that results from developing and washing away the hybrid resist layer 201.

As shown in FIG. 2C, the second resist layer 207 is exposed to radiation through a mask 211, is baked and is developed, such that an opening 213 is created over the hybrid resist layer 201, defining the location for the submicron T-gate 113. A blanket exposure typically is employed prior to development (in addition to the exposure through the mask 211). The preferred exposure dose, bake time and bake temperature are 150–250 milliJoules/$cm^2$ (typically about 200 milliJoules/$cm^2$), 15–30 minutes (typically about 20 minutes) and 100–120° C. (typically 100° C.), respectively. Because the image width of the top 117 of the T-gate 113 is relatively large, tolerance control during exposure of the second resist layer 207 is not critical. The remainder of the hybrid resist layer 201 is covered by the second resist layer 207.

Figure 2D:
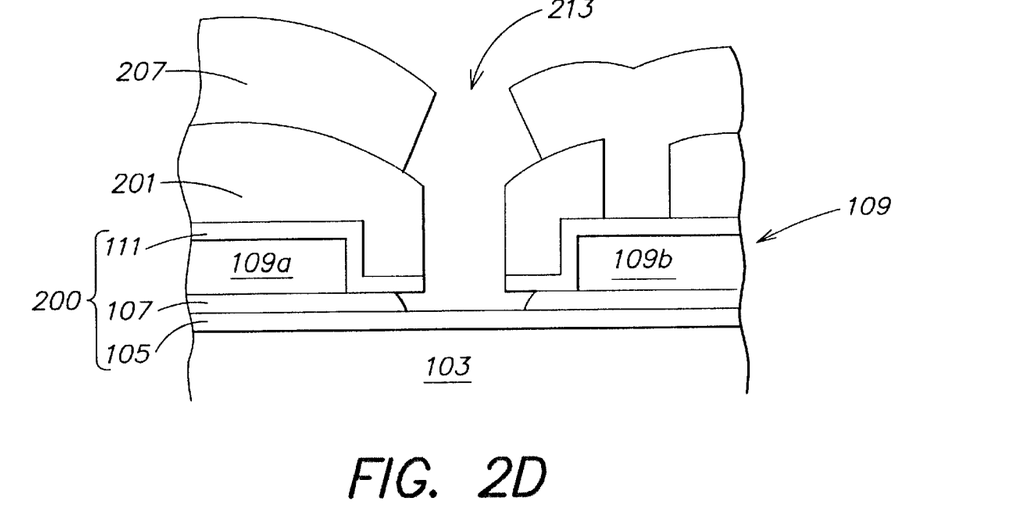

Following formation of the opening 213 in the second resist layer 207, the exposed portion of the silicon nitride layer 111 (e.g., exposed through area 205a of hybrid resist layer 201) and part of the GaAs cap layer 107 are RIE etched (e.g., via a Freon 12 etch), and the GaAs cap layer 107 is wet etched. FIG. 2D illustrates the structure 200 following the RIE etching of the silicon nitride layer 111 and part of the GaAs cap layer 107, and after the wet etching of the remainder of the GaAs cap layer 107. The GaAs cap layer 107 preferably is wet-etched using a solution comprising 50% diluted citric acid mixed with hydrogen peroxide (10:1 by volume). Such a solution etches the GaAs cap layer 107 isotropically so as to undercut the silicon nitride layer 111 without etching the etch stop layer 105. Shorting of the T-gate 113 via the GaAs cap layer 107 thereby is prevented.

Figure 2E:
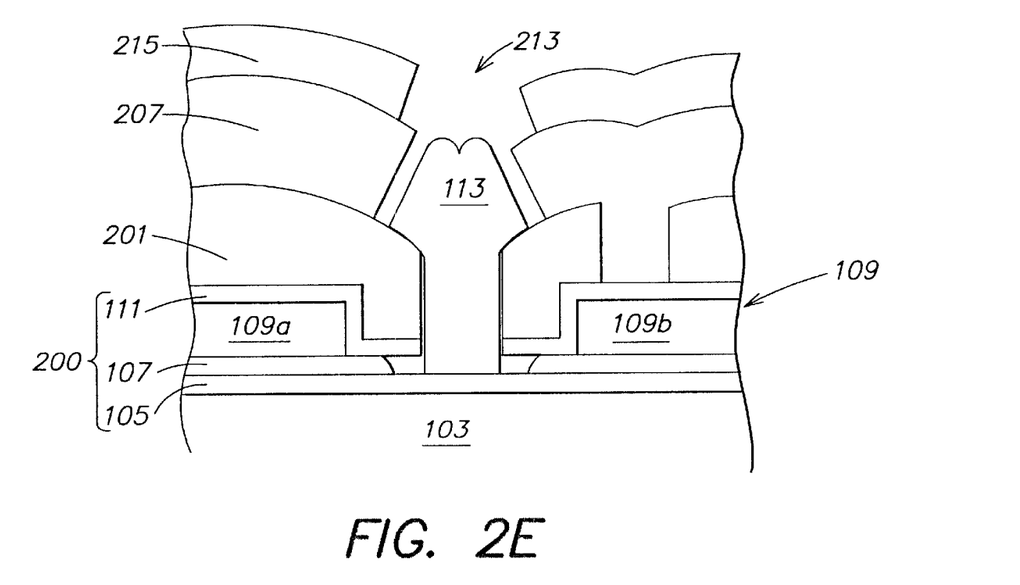

Following etching of the silicon nitride layer 111 and the GaAs cap layer 107, a Ti—Pt—Au gate metallization layer 215 having a thickness of about 350 nanometers is sputter-deposited over the structure 200 as illustrated in FIG. 2E. The T-gate 113 thereby is formed. In order to ensure proper formation of the resultant submicron T-gate 113, the Ti—Pt—Au gate metallization layer 215 must not be continuous across the opening 213 of the second resist layer 207 (e.g., so as to allow solvents to dissolve the second resist layer 207 during lift-off, as described below).

Following deposition of the Ti—Pt—Au gate metallization layer 215, lift-off of the portion of the metal layer over-laying the second resist layer 207 is performed by exposing the structure 200 to a solvent such as n-methyl-pyrrolidone. Thereafter, the structure 200 is cleaned utilizing ozone or an oxygen plasma to remove both the second resist layer 207 and the hybrid resist layer 201. The T-gate structure 101 of FIG. 1 thereby is produced with the top 117 and the base 115 of the T-gate 113 both comprising Ti—Pt—Au.

Figure 3A:
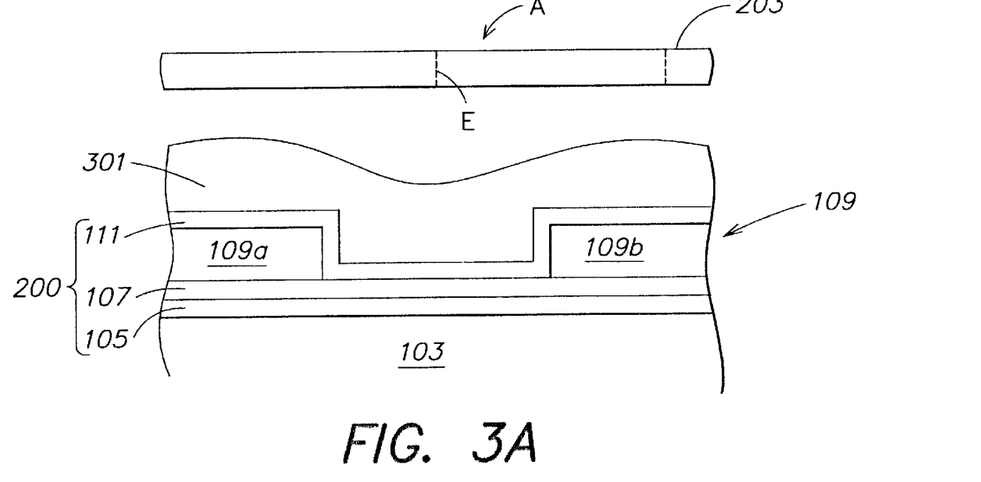
FIGS. 3A–F are cross-sectional illustrations of a second novel fabrication method used to fabricate the T-gate of FIG. 1.
Figure 3B:
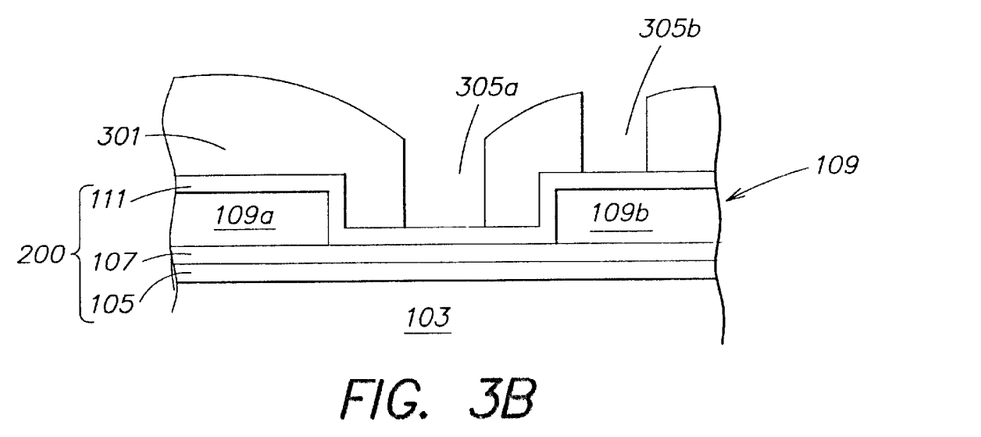
Figure 3C:
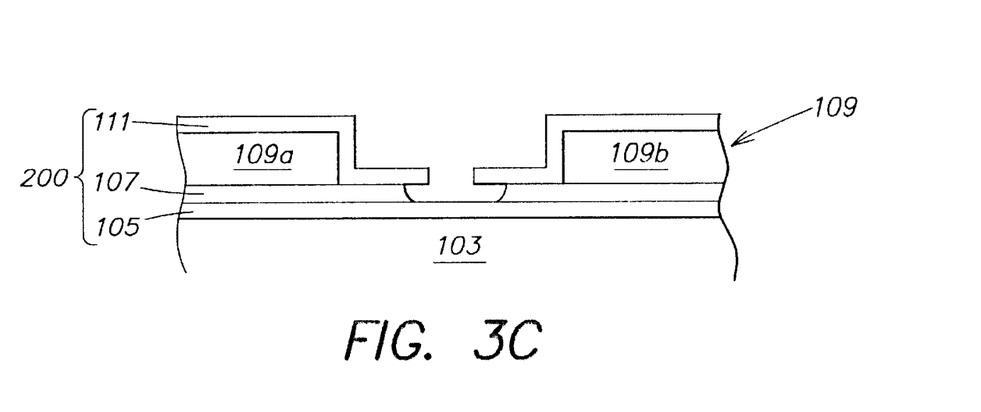

FIGS. 3A–F are cross-sectional illustrations of a second novel fabrication method used to fabricate the T-gate structure 101 of FIG. 1. The second novel fabrication method initially is similar to the first novel fabrication method of FIGS. 2A–E: a hybrid resist layer 301 is deposited over the structure 200 (FIG. 3A) and is then exposed through the mask 203 to form areas 305a, 305b therein (FIG. 3B). Thereafter, instead of depositing a second resist layer over the hybrid resist layer 301, a groove is etched in the silicon nitride layer 111 and in the GaAs cap layer 107 (e.g., via RIE etching and wet etching as previously described) and the hybrid resist layer 301 is removed as shown in FIG. 3C. The T-gate 113 will ultimately be formed at this site.

Figure 3D:
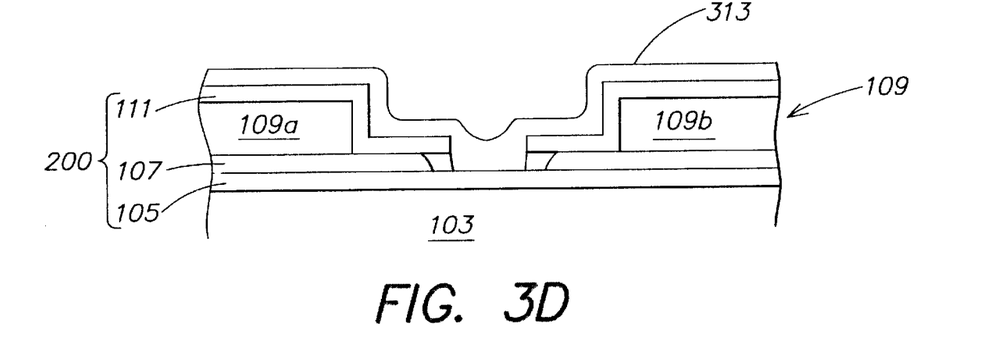

Following etching of the silicon nitride layer 111 and the GaAs cap layer 107, a WSiN conductive layer 313 is deposited over the structure 200. FIG. 3D illustrates the structure 200 following the deposition of the WSiN conductive layer 313. The portion of the WSiN conductive layer 313 which fills the groove 309 comprises the base 115 of the resulting T-gate (described below).

Figure 3E:
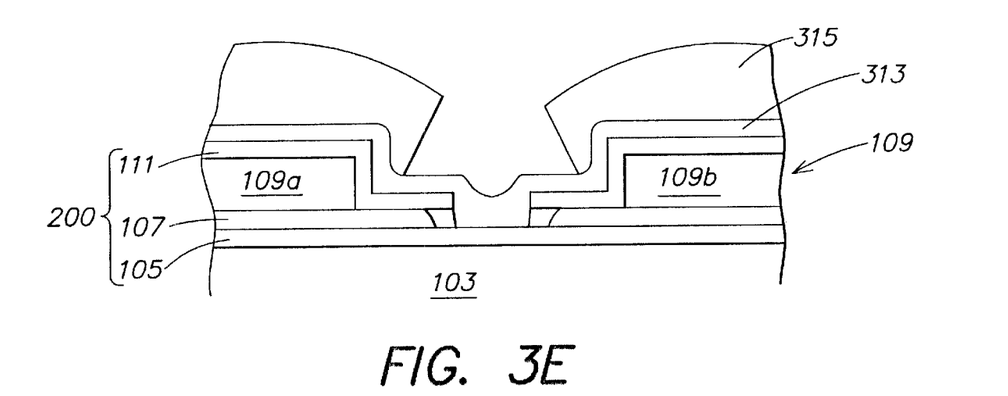

Following deposition of the WSiN conductive layer 313, a second resist layer 315 is deposited over the WSiN conductive layer 313 and is patterned for formation of the top 117 of the T-Gate 113. FIG. 3E shows the second resist layer 315 over the WSiN conductive layer 313, following exposure, baking and development.

Figure 3F:
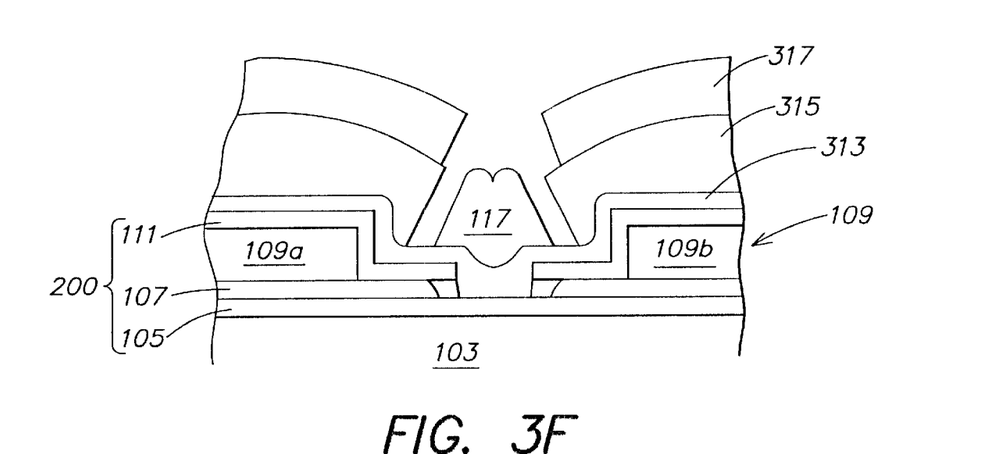

Following patterning of the second resist layer 315, a Ti—Pt—Au metallization layer 317 is deposited on top of the second resist layer 315, thereby filling the opening in the second resist layer 315 to form the top 117 of the T-gate 113 as shown in FIG. 3F. Thereafter, lift-off of the portion of the metal layer overlaying the second resist layer 315 is performed, the second resist layer 315 is removed and the exposed portion of the WSiN conductive layer 313 is etched away via RIE. The Ti—Pt—Au top 117 is used as an RIE mask to protect the portion of the WSiN conductive layer 313 utilized for the base 115 of the T-gate. The T-gate structure 101 of FIG. 1 results with the top 117 comprising Ti—Pt—Au and the base 115 comprising WSiN.

By employing a hybrid resist to form T-gate structures, the time, expense and poor linewidth control associated with e-beam lithography is avoided. Additionally, because the use of a hybrid resist results in fine, uniform features with image quality that is nearly independent of exposure dose or mask dimensions, device linewidth remains nearly constant across each die and from substrate to substrate.

The foregoing description discloses only the preferred embodiments of the invention, modifications of the above disclosed apparatus and method which fall within the scope of the invention will be readily apparent to those of ordinary skill in the art. For instance, the novel T-gate formation methods of the present invention may be used to form T-gates on other semiconductor substrates such as silicon-germanium substrates or III–V substrates, or for other semiconductor devices. Other metallization layers may be used in place of Ti—Pt—Au (e.g., AuGePt/Au), and other resist adhesion layers in place of silicon nitride (e.g., silicon dioxide) may be employed. Additionally, instead of using both RIE and wet etching to etch the silicon nitride layer 111 and the GaAs cap layer 107, a wet etch alone may be employed (although typical silicon nitride wet etches such as phosphoric acid may deleteriously attack photoresist layers). If a silicon dioxide layer is employed in place of the silicon nitride layer 111, a wet etch such as buffered hydrofluoric acid or dilute hydrofluoric acid may be used to wet etch both the silicon dioxide layer and the GaAs cap layer 107. If a wet etch alone is employed, an RIE etch stop layer is not required. Further, if it is desirable to fabricate contact "landing-pad" areas in the hybrid resist layer 201, the mask 203 may be provided with angled edges so as to cause a zig-zag pattern in the hybrid resist layer 201. A larger footprint for contacting the top 117 to the base 115 of the T-gate 113 thereby results. A larger contact area in the hybrid resist layer 201 also can be formed by means of a "gray scale" mask, in which grating structures or diffraction effects are used to block some radiation from exposed areas. In lightly exposed areas, the hybrid negative tone is not triggered, while the hybrid positive tone is triggered, leading to the formation of a positive tone resist pattern in the gray areas. Alternatively, a second exposure step may be performed on the hybrid resist layer 201 and the post exposure bake may be omitted from the second exposure step. In the absence of a post exposure bake, negative tone crosslinking does not occur, but the positive tone chemistry is activated simply by the exposure. In this manner a standard positive tone resist pattern can be created in some areas of the hybrid resist layer 201 and a larger footprint for contacting the top 117 to the base 115 of the T-gate 113 results.

Accordingly, while the present invention has been disclosed in connection with the preferred embodiments thereof, it should be understood that other embodiments may fall within the spirit and scope of the invention, as defined by the following claims.

The invention claimed is:

1. A method of forming a T-gate on a substrate comprising:

providing a substrate;

depositing a first hybrid resist layer on the substrate;

providing a first mask having a reticle feature with an edge;

positioning the mask above the first hybrid resist layer so that the edge of the reticle feature is above a desired location for a base of the T-gate;

exposing only the portion of the first hybrid resist layer underlying the edge of the reticle to radiation through the mask;

developing the exposed portion of the first hybrid resist layer to define a first opening therein for the base of the T-gate, the opening having a loop feature formed in the first hybrid resist layer having a pattern consistent with the edge of the reticle;

trimming the loop feature formed in the first hybrid resist layer by filling in a portion of the loop feature with a second resist layer and forming a second opening over the first opening to define a location for the T-gate; and forming the T-gate within the defined location.

2. The method of claim 1 wherein providing the substrate comprises providing a semiconductor substrate.

3. The method of claim 2 wherein providing the semiconductor substrate comprises providing a semiconductor substrate selected from the group consisting of a gallium arsenide substrate and a silicon germanium substrate.

4. The method of claim 1 wherein exposing the hybrid resist layer to radiation through the mask comprises exposing the hybrid resist layer to at least one of deep ultra-violet light, x-rays, I-line, an ion beam or an electron beam.

5. The method of claim 1 wherein exposing the hybrid resist layer to radiation through the mask comprises exposing the hybrid resist layer through the mask having at least one angled edge and a gray scale.

6. The method of claim 1 further comprising performing a second exposure of the hybrid resist layer absent a post-exposure bake prior to developing the exposed hybrid resist layer.

7. The method of claim 1 wherein the loop feature formed in the first hybrid resist layer is trimmed prior to formation of the T-gate to prevent shorting of said T-gate.

8. The method of claim 1 further comprising:

depositing the second resist layer over the first hybrid resist layer;

forming the second opening in the second resist layer for a top of the T-gate, the second opening being directly over the first opening;

depositing a gate metallization layer over the second resist layer, within the second opening of the second resist layer and within the first opening of the first hybrid resist layer so as to form the T-gate therein;

lifting-off the gate metallization layer that covers the second resist layer; and removing the second resist layer and the first hybrid resist layer from the substrate.

9. The method of claim 8 further comprising etching the substrate through the second opening in the second resist layer and through the first opening in the first hybrid resist layer prior to depositing the gate metallization layer.

10. The method of claim 8 wherein depositing the second resist layer over the first hybrid resist layer comprises depositing a negative resist layer over the first hybrid resist layer.

11. The method of claim 8 wherein trimming the loop feature and forming the second opening in the second resist layer comprises:

positioning a second mask having a reticle feature for defining the top of the T-gate above the second resist layer so that the reticle feature is positioned above the first opening of the first hybrid resist layer;

exposing the second resist layer to radiation through the mask; and developing the exposed second resist layer to define the second opening therein the second resist layer for the top of the T-gate wherein the second opening is formed over the first opening to define the location for the T-gate.

12. The method of claim 11 further comprising:

performing a post exposure bake after exposing the second resist layer; and performing a blanket exposure of the second resist layer after performing the post exposure bake and prior to developing the second resist layer.

13. The method of claim 8 wherein depositing a gate metallization layer comprises depositing a Ti—Pt—Au metallization layer.

14. The method of claim 1 whereby a definition of a high resolution pattern is enabled by exposing and developing only the portion of the hybrid resist layer underlying the edge of the reticle.

15. The method of claim 14 wherein the high resolution pattern is less than 0.05 micron.

16. A method of forming a T-gate on a substrate comprising:

providing a substrate layer;

depositing an etch-stop layer over the substrate layer;

depositing a cap layer over the etch stop layer;

depositing a metallization layer over the cap layer;

patterning the metallization layer to form source and drain regions thereby exposing a portion of the cap layer;

conformally depositing a silicon nitride layer over the source and drain regions, and over the exposed portion of the cap layer; depositing a first hybrid resist layer on silicon nitride layer; positioning a first mask having a reticle feature with an edge above the first hybrid resist layer so that the edge of the reticle feature is above a desired location for a base of the T-gate;

exposing only the portion of the first hybrid resist layer underlying the edge of the reticle to radiation through the mask;

developing the exposed portion of the first hybrid resist layer whereby the exposed portion of the first hybrid resist layer is washed away by a developing solution to define an opening therein the first hybrid resist layer used to form the base of the T-gate, the opening having a loop feature formed in the first hybrid resist layer having a pattern consistent with the edge of the reticle;

trimming the loop feature formed in the first hybrid resist layer to prevent shorting the T-gate; and forming the T-gate within a location of the trimmed loop feature formed in the first hybrid resist layer.

17. The method of claim 16 wherein the steps of trimming and forming the T-gate within the location of the trimmed loop feature formed in the first hybrid resist layer comprises:

depositing a second resist layer over the first hybrid resist layer whereby the second resist fills a portion of the loop feature formed in the first hybrid resist layer;

forming a second opening in the second resist layer for a top of the T-gate by positioning a second mask above the second hybrid resist layer and developing the second hybrid resist layer, the second opening exposing portions of the silicon nitride layer and the cap layer stopping at the etch-stop layer;

etching the cap layer using a solution that undercuts the silicon nitride layer without etching the etch-stop layer; and depositing a gate metallization layer over the second resist layer, within the second opening of the second resist layer and within the first opening of the first hybrid resist layer so as to form the T-gate therein.

18. The method of claim 17 further comprising:

lifting-off the gate metallization layer that covers the second resist layer; and removing the second resist layer and the first hybrid resist layer from the substrate.

* * * * *